Jan. 1, 1963 W. HÄNLEIN 3,071,495

METHOD OF MANUFACTURING A PELTIER THERMOPILE

Filed Jan. 14, 1959

United States Patent Office 3,071,495

Patented Jan. 1, 1963

3,071,495

METHOD OF MANUFACTURING A PELTIER THERMOPILE

Walter Hänlein, Erlangen, Germany, assignor to Siemens-Schuckertwerke Aktiengesellschaft, Berlin-Siemensstadt, Germany, a corporation of Germany Filed Jan. 14, 1959, Ser. No. 786,790
Claims priority, application Germany Jan. 17, 1958
7 Claims. (Cl. 117—212)

My invention relates to piles or arrays of thermocouples, and in a preferred aspect, to thermopiles of the Peltier type for use as heat pumps or cooling devices.

In the conventional thermopiles the thermoelectrically dissimilar components of the thermocouples are joined together by soldering. The electric transition resistance at the solder bonds has a considerable effect upon the efficiency of the individual couples and hence upon that of the thermopile as a whole. Various methods have become known for producing thermocouples and piles with the aim of reducing the transition resistance. These methods are rather complicated and expensive with respect to manufacturing requirements. This is particularly so if heat conducting fins are to be solder-bonded between the thermoelectric components. Other known proposals, such as joining the thermoelectric components by electrolytic methods or by contacting pressure have been found unsatisfactory.

It is therefore an object of my invention to provide a thermopile equipped with heat conducting fins, that does away with the soldering process and is considerably simpler and less costly to manufacture than the thermopiles heretofore known.

Another object of my invention, subsidiary to the one mentioned, is to devise a method and a thermopile, particularly suitable for use as Peltier pile, which affords a greatly minimized transition resistance at the couple junctions conjointly with the above-mentioned simplified manufacture.

According to a feature of my invention, the thermopile comprises an electrically and thermally insulating carrier which has a portion of its surface covered by a series of coatings which alternately form the respective thermoelectrically dissimilar components of the pile and are all area-bonded to the carrier, the mutually adjacent marginal zones of each two consecutive areas of the series being coated with a junction strip of good conducting metal which is integral with fin areas of the same metal that are also area-bonded to the carrier on alternately different sides of the series. According to a more specific and preferred feature, the coatings that form the couple components as well as those forming the junction strips and fins, consist all of vapor-deposited substance.

According to one of the method features of my invention, the thermoelectric components of a thermopile are deposited by vaporization upon an electrically insulating and thermally poor conducting carrier so as to coat a series of respective areas, and the mutually adjacent marginal zones of each two consecutive areas are then coated by vaporization with a thermally good conducting metal so as to form a bonded junction between the components of each couple, but each latter coating is given an extended area alongside of the said series so as to form a heat conducting fin integral with the bonded junction, the coated fin areas being located alternately on opposite sides of the series of thermocouple components.

The foregoing and other features of my invention, set forth with particularity in the claims annexed hereto, will be further explained with reference to the embodiment of a Peltier pile according to the invention schematically illustrated by way of example on the accompanying drawing in which:

Figure 1:
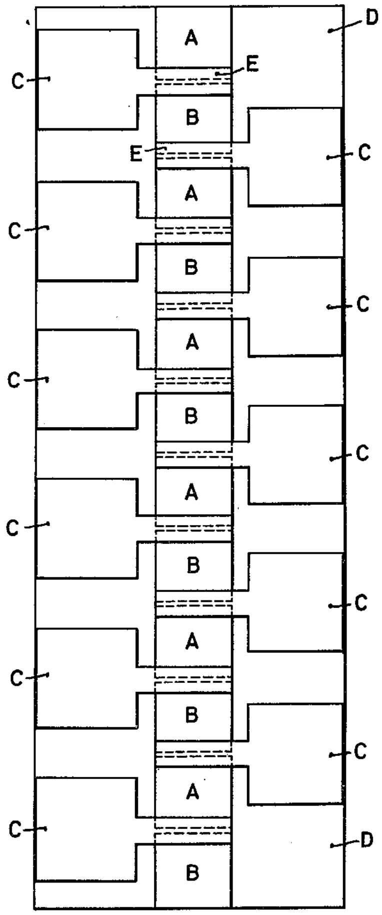
FIG. 1 is a top view of the pile.
Figure 2:
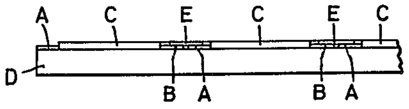
FIG. 2 is a partial and partly sectional view upon a longitudinal side of the pile.
Figure 3:
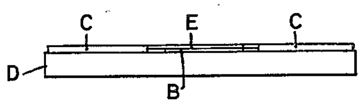
FIG. 3 a front view of the pile.

The illustrated thermopile has a series of thermoelectrically dissimilar components A and B deposited on an insulating carrier strip D which also carries a number of heat-conducting fins C extending away from the series on alternately different sides thereof. Each two adjacent components A and B are slightly spaced from each other and are electrically interconnected by a strip-shaped coating E integral with one of the respective fins C.

The thermopile, according to the invention, is preferably produced by vaporizing the thermoelectric components in high vacuum upon the carrier C with the aid of masks or stencils so used, that during a first vaporization step only the components A are deposited upon the carrier whereas the areas of the components B are shielded from vapor deposition by the mask. In the next step the areas of components A are covered by a mask, and the components B are deposited by vaporization.

Suitable as insulating carrier B are glass or ceramic materials. Other thermically and electrically poor conducting substances are also applicable, provided they are resistant to the vaporization temperatures to be used.

After depositing the components A and B upon the carrier strip in the manner described, the junction strips E are deposited upon the marginal areas, again with the aid of a mask, by vaporization of good conducting metal, preferably copper or aluminum. The openings of the mask then being used are such that the fins C are simultaneously deposited from the metal vapor upon the carrier.

The method is particularly favorable if the two thermoelectric components A and B consist fundamentally of the same semiconductor substance and differ from each other only by the conductance-promoting doping applied thereto. Among the substances suitable as fundamental substance for the two components is bismuth telluride. When using this semiconductor compound, a bismuth telluride coating may first be deposited upon the entire length of the insulating carrier by vaporizing bismuth and tellurium from two separate boats within the vacuum container in which the method is being performed. In a second vaporization step, the areas of components A are subjected to vaporized tin. Subsequently the areas of components B are subjected to the vapor of silver iodide. If desired, the assembly thus far produced, may be subjected to tempering. Due to the doping described, the areas A become p-conducting and the areas B become n-conducting. During the individual vaporizing steps, the particular areas, such as A in one case and B in the other case, are masked-off as mentioned above. Ultimately, the junction strips and appertaining fins of copper are vaporized onto the particular boundary zones of the n-type and b-type bismuth telluride areas.

More in detail, the method just described is preferably performed in accordance with the one disclosed and claimed in the copending application of Karl-Georg Günther, Serial No. 739,577, filed June 3, 1958, and assigned to the assignee of the present invention. The thermopile carrier to be used for the purpose of the present invention consists preferably of a strip of mica. At first a uniform layer of $Bi_2Te_3$ is vaporized in a vacuum vessel onto the masked-off carrier surface. This is done by simultaneously evaporating, from separate boats, the bismuth component at a temperature of 700 to 800° C. and the Te component at a temperature between 300 and 400° C. Due to the difference in temperature, the vapor pressure of Te and hence the excess of the component Te in the vaporous phase is about 10 to 40 times that of the Bi component, the mica strip being kept at a temperature between 400 and 500° C. In this manner, a $Bi_2Te_3$ coating of n-type conductance is produced, a layer thickness of about 10 microns being sufficient in general.

For forming the p-type areas, alternate n-type areas are masked, and the exposed areas of the coating are then subjected to vaporized acceptor substance, such as Sn, Pb or Si, for instance. The quantity of the vapor-deposited doping substance, i.e. the duration of the doping treatment, is chosen in accordance with the desired degree of doping and is generally between 1 and $10^{-2}$ doping substance per mil by weight of semiconductor substance.

Thereafter, the junction strips and fins are vapor deposited in the above-described manner and are given a thickness approximately equal to that of the thermopile components, namely about 10 microns. Preferably used for this purpose is copper at a vaporization temperature of about 1200° C., the insulating carrier then being kept at approximate room temperature, i.e. at about 20° C.

Well suitable as thermopile carrier, aside from mica, are certain kinds of glasses, available in industry, whose thermal coefficient of expansion is nearly coincident with that of $Bi_2Te_3$ and whose heat conductance is as much below that of $Bi_2Te_3$ as feasible. These requirements are met by foam glass with an air content of about 80% by volume.

The $Bi_2Te_3$ coating produced in the above-described manner exhibit thermoelectric data substantially identical with those of $Bi_2Te_3$ produced by the conventional melting-together of the components. Thus, the effectiveness was found to be $2.10^{-3}$ degree $^{-1}$; and the thermoforce was found to be 200 microvolt per degree. The specific conductivity was 600 (ohm cm.)$^{-1}$ for an amount of doping corresponding to $2.10^{-19}$ lattice defect atoms per cm.$^3$.

The invention is analogously applicable for all other thermoelectric substances capable of being vaporized. Suitable, for example, are cadmium antimonide (CdSb), as well as indium arsenide (InAs) and other intermetallic semiconductor compounds of the type $A_{III}B_V$, formed by respective elements of the third and fifth groups of the periodic system and having higher carrier mobility than germanium, such semiconductors being particularly favorable for thermoelectric purposes.

The method of producing a thermopile according to the invention also permits, in a simple manner, to form mixed crystals to serve as thermoelectric components. For this purpose, in the above-described example of bismuth telluride, the areas of components B are subjected to vaporized selenium and the areas of components A are vapor coated with antimony in two sequential steps with the aid of masks as described above, this being done prior to doping the two areas A and B in the above-described manner. As a result, mixed crystals are produced, composed of bismuth telluride ($Bi_2Te_3$) and bismuth selenide ($Bi_2Se_3$) in the areas B, and composed of bismuth telluride and antimony telluride in areas A. The composition of each mixture can be selected in accordance with the desired difference of the respective thermoforces.

Among the various mix-crystal components thus produceable for thermopiles according to the invention are those of indium arsenide (IAs) and indium phosphide (InP), or gallium arsenide (GaAs) and gallium phosphide known from U.S. Patent No. 2,858,275 of O. G. Folberth.

Aside from the above-mentioned advantages of thermopiles and their manufacturing method according to the invention, the components of the pile according to the invention, being of foil thickness, possess relatively small cross sections and thus afford the use of correspondingly high operating voltages when using such a pile as a Peltier cooling device.

I claim:

1. The method of producing a thermopile, which comprises coating a continuous surface portion of an electrically and thermally insulating carrier on serially alternating and mutually adjacent areas with separate coatings of two thermoelectrically different thermocouple materials, depositing upon the respective adjacent marginal zones of each two consecutive ones of said coatings a layer of thermally good conducting metal and simultaneously depositing said metal upon a contiguously adjacent area on another portion of said carrier surface so as to simultaneously form a joining strip interconnecting said two coatings and an integral fin extending laterally away from said series of coatings, the fin areas being larger than the strip areas and extending alternately in different directions away from the series of coatings.

2. The method of producing a thermopile, which comprises the steps of vaporizing in vacuum a number of first thermoelectric coatings upon a series of mutually spaced and masked-off area on a continuous surface of a single electrically and thermally insulating carrier, vaporizing in vacuum a number of second thermoelectric coatings upon masked-off areas each located between two of those previously covered by said first coatings, and vaporizing in vacuum upon another number of masked-off areas of the carrier a number of layers of thermally good conducting material, each of the latter areas having a portion overlapping the adjacent marginal zones of each two consecutive ones of said coatings and having an integral fin portion extending laterally away from the series of coatings in a direction different from that of the next following fin portion.

3. The method of producing a thermopile, which comprises the steps of vaporizing in vacuum a number of first thermoelectric coatings upon a series of mutually spaced and masked-off areas on a continuous surface of an electrically and thermally insulating carrier, vaporizing in vacuum a number of second thermoelectric coatings upon masked-off areas each located between two of those previously covered by said first coatings, separately vaporizing onto each of said numbers of first and second coatings a substance forming mixed crystals with the substance of said respective first and second coatings, and vaporizing upon another number of masked-off areas of the carrier a number of layers of thermally good conducting material, each of the latter areas having a portion overlapping the adjacent marginal zones of each two consecutive ones of said coatings and having an integral fin portion extending laterally away from the series of coatings in a direction opposed to that of the next following fin portion.

4. The method of producing a thermopile, which comprises the steps of vaporizing in vacuum a number of first thermoelectric coatings of semiconductor compound upon a series of masked-off areas on the surface of an electrically and thermally insulating carrier, vaporizing in vacuum a doping substance upon each second one of said areas and another doping substance upon each intermediate area, one of said doping substances being a donor and the other an acceptor whereby alternating areas of said series are made thermoelectrically dissimilar, and vaporizing upon another number of masked-off areas of the carrier a number of layers of thermally good conducting material, each of the latter areas having a portion overlapping the adjacent marginal zones of each two consecutive ones of said coatings and having an integral fin portion extending laterally away from the series of coatings in a direction opposed to that of the next following fin portion.

5. In the method of making thermopiles according to claim 4, said semiconductor compound being bismuth telluride and said doping substances being tin and silver iodide respectively.

6. The method of producing a thermopile, which comprises the steps of vaporizing in vacuum a number of first thermoelectric coatings of semiconductor compound upon a series of masked-off areas on the surface of an electrically and thermally insulating carrier, vaporizing in vacuum two different mix crystals forming substances upon alternating ones of said areas whereby each two adjacent areas are converted into dissimilar thermocouple components, vaporizing in vacuum a doping substance upon each second one of said areas and another doping substance upon each intermediate area, one of said doping substances being a donor and the other an acceptor, and vaporizing upon another number of masked-off areas of the carrier a number of layers of thermally good conducting material, each of the latter areas having a portion overlapping the adjacent marginal zones of each two consecutive ones of said coatings and having an integral fin portion extending laterally away from the series of coatings in a direction opposed to that of the next following fin portion.

7. In a method of making thermopiles according to claim 6, said semiconductor compound being bismuth telluride, and said mix-crystal forming substances being selenium and antimony respectively.

References Cited in the file of this patent

UNITED STATES PATENTS

| | | |
|---|---|---|
| 2,844,638 | Lindenblad | July 22, 1955 |
| 2,849,331 | Turbolente | Aug. 26, 1958 |
| 2,865,783 | Henderson et al. | Dec. 23, 1958 |
| 2,877,283 | Justi | Mar. 10, 1959 |

FOREIGN PATENTS

| | | |
|---|---|---|
| 307,775 | Switzerland | Aug. 16, 1955 |